US012289823B2

(12) United States Patent
Han et al.

(10) Patent No.: US 12,289,823 B2
(45) Date of Patent: Apr. 29, 2025

(54) METAMATERIAL ELECTROMAGNETIC ABSORBER

(71) Applicants: HYUNDAI MOTOR COMPANY, Seoul (KR); KIA CORPORATION, Seoul (KR); CHUNG ANG University industry Academic Cooperation Foundation, Seoul (KR)

(72) Inventors: Seung Hyun Han, Suwon-si (KR); Sung Joon Lim, Anyang-si (KR)

(73) Assignees: HYUNDAI MOTOR COMPANY, Seoul (KR); KIA CORPORATION, Seoul (KR); CHUNG ANG University industry Academic Cooperation Foundation, Seoul (KR)

( * ) Notice: Subject to any disclaimer, the term of this patent is extended or adjusted under 35 U.S.C. 154(b) by 752 days.

(21) Appl. No.: 17/511,292

(22) Filed: Oct. 26, 2021

(65) Prior Publication Data
US 2022/0225494 A1 Jul. 14, 2022

(30) Foreign Application Priority Data

Nov. 30, 2020 (KR) .................. 10-2020-0164620

(51) Int. Cl.
*H05K 1/02* (2006.01)
*B32B 3/26* (2006.01)
(Continued)

(52) U.S. Cl.
CPC ........... *H05K 1/0231* (2013.01); *B32B 3/266* (2013.01); *H01F 27/288* (2013.01); *H01G 4/40* (2013.01);
(Continued)

(58) Field of Classification Search
CPC ................. H01F 27/288; H01G 4/40
See application file for complete search history.

(56) References Cited

U.S. PATENT DOCUMENTS 6,545,212 B1 * 4/2003 Uchida ............... H05K 1/0233
174/394
8,982,008 B2 3/2015 Parsche
(Continued)

FOREIGN PATENT DOCUMENTS

KR 20100046579 A 5/2010
KR 20140026401 A 3/2014
(Continued)

OTHER PUBLICATIONS

Liu et al. "A Dual-Band Negative Permeability and Near-Zero Permeability Metamaterials for Wireless Power Transfer System," in IEEE Transactions on Industrial Electronics, vol. 68, No. 8, pp. 7072-7082, Published Jul. 21, 2020.*
(Continued)

*Primary Examiner* — Alicia J Weydemeyer
(74) *Attorney, Agent, or Firm* — Lempia Summerfield Katz LLC

(57) ABSTRACT

A metamaterial electromagnetic absorber includes a substrate having a first surface on which electromagnetic waves are incident and a second surface opposite the first surface. The substrate is made of a metamaterial. The metamaterial electromagnetic absorber also includes a first inductive conduction pattern and a second inductive conduction pattern formed on the first surface and the second surface, respectively.

7 Claims, 9 Drawing Sheets

(51) Int. Cl.
  *H01F 27/28* (2006.01)
  *H01G 4/40* (2006.01)
  *H05K 1/11* (2006.01)
  *H05K 1/16* (2006.01)
  *H05K 9/00* (2006.01)

(52) U.S. Cl.
  CPC ........... *H05K 1/0233* (2013.01); *H05K 1/115* (2013.01); *H05K 1/165* (2013.01); *H05K 9/0081* (2013.01); *H05K 2201/10015* (2013.01)

(56) References Cited

U.S. PATENT DOCUMENTS

| | | | |
|---|---|---|---|
| 2010/0244999 A1* | 9/2010 | Ryou | H01P 3/081 333/246 |
| 2011/0163826 A1* | 7/2011 | Toujo | H01P 7/00 333/175 |
| 2011/0199273 A1 | 8/2011 | Kim et al. | |
| 2012/0249396 A1 | 10/2012 | Parsche | |
| 2018/0370197 A1 | 12/2018 | Nagamune et al. | |

FOREIGN PATENT DOCUMENTS

| | | |
|---|---|---|
| KR | 20180098547 A | 9/2018 |
| KR | 20180134033 A | 12/2018 |

OTHER PUBLICATIONS

Jonghoon Kim et al., Electromagnetic interference and radiation from wireless power transfer systems, IEEE Int. Symp. Electromagn. Compat., pp. 171-176, Sep. 2014.

Seungyoung Ahn et al., Optimized shield design for reduction of EMF from wireless power transfer systems, IEICE Electronics Express, vol. 11, No. 2, pp. 1-9, Dec. 24, 2013.

Tetsu Shijo et al., EMI reduction technology in 85 kHz band 44 kW wireless power transfer system for rapid contactless charging of electric bus, ECCE 2016—IEEE Energy Conversion Congress and Exposition, 2016; 3 pp.

Office Action cited in corresponding Korean patent application No. 10-2020-0164620; Dec. 24, 2024; 10 pp.

* cited by examiner

METAMATERIAL ELECTROMAGNETIC ABSORBER

CROSS-REFERENCE TO RELATED APPLICATION

This application claims the benefit of priority to Korean Patent Application No. 10-2020-0164620, filed on Nov. 30, 2020, with the Korean Intellectual Property Office, the disclosure of which is herein incorporated by reference in its entirety.

BACKGROUND

1. Field of the Disclosure

The present disclosure relates to an electromagnetic absorber, and more particularly to an electromagnetic absorber manufactured using a metamaterial.

2. Description of the Related Art

In general, an electromagnetic absorber is a device that absorbs electromagnetic waves incident on the surface thereof so as to be consumed as heat in order to reduce the electromagnetic waves that are reflected or transmitted. An electromagnetic absorber thus is used to block electromagnetic waves. In particular, a wireless charging system for wirelessly charging a battery of an electric vehicle transmits power in an electromagnetic induction mode or a magnetic resonance mode, whereby intense electromagnetic waves are generated. Consequently, an electromagnetic absorber is essentially used in order to prevent electromagnetic waves from adversely affecting human beings or electric and electronic parts therearound.

A conventional electromagnetic absorber or electromagnetic shielding agent applied to an electric vehicle battery wireless charging system is manufactured using aluminum or ferrite and aluminum. An electromagnetic shielding agent manufactured using aluminum alone shields electromagnetic waves using an eddy current. Although it is possible to shield electromagnetic waves, the intensity of a magnetic field is reduced by the effect of the eddy current. An electromagnetic absorber simultaneously using ferrite and aluminum has been developed in order to solve the problem with the aluminum shielding agent and is capable of maintaining the intensity of a magnetic field while maintaining electromagnetic shielding performance. However, ferrite is heavy and expensive.

The matters disclosed in this section are merely for enhancement of understanding of the general background of the disclosure and should not be taken as an acknowledgment or any form of suggestion that the matters form the related art already known to a person of ordinary skill in the art.

SUMMARY

In view of the foregoing, there is a need for electromagnetic absorbing or shielding technology capable of reducing weight and cost while having the same performance as a conventional electromagnetic shielding agent.

It is an object of the present disclosure to provide a metamaterial electromagnetic absorber capable of being manufactured so as to have reduced weight and lower cost than a conventional electromagnetic absorber or electromagnetic shielding agent made of ferrite and aluminum. It is another object of the present disclosure to provide a metamaterial electromagnetic absorber capable of securing electromagnetic shielding performance equal to or higher than the conventional electromagnetic absorber or electromagnetic shielding agent.

In accordance with an aspect of the present disclosure, the above and other objects can be accomplished by the disclosed metamaterial electromagnetic absorber, which includes: a substrate having a first surface on which electromagnetic waves are incident and a second surface opposite the first surface, the substrate being made of a metamaterial; and a first inductive conduction pattern and a second inductive conduction pattern formed on the first surface and the second surface, respectively.

The metamaterial electromagnetic absorber may further include a conductive plate disposed spaced apart from the substrate in a direction away from the second surface. The conductive plate may be grounded.

The metamaterial may be one of glass-reinforced epoxy laminate or FR4, polyester, epoxy, silicone, Teflon, or a combination of two or more thereof.

The first inductive conduction pattern and the second inductive conduction pattern may be electrically connected to each other to form a resonance circuit.

Opposite ends of the inductive conduction pattern formed on the first surface and the inductive conduction pattern formed on the second surface may be electrically connected to each other through a conductive via hole formed through the substrate.

The metamaterial electromagnetic absorber may further include a capacitor connected to the inductive conduction pattern in series.

The first inductive conduction pattern and the second inductive conduction pattern may be formed in a symmetrical fashion.

In accordance with another aspect of the present disclosure, a metamaterial electromagnetic absorber is provided, which includes: a substrate having a first surface on which electromagnetic waves are incident and a second surface opposite the first surface, the substrate being made of a metamaterial; a first inductive conduction pattern and a second inductive conduction pattern formed on the first surface and the second surface, respectively; a capacitor connected to the inductive conduction pattern in series; and a conductive plate disposed spaced apart from the substrate in a direction away from the second surface. The conductive plate is grounded. Opposite ends of the inductive conduction pattern formed on the first surface and the inductive conduction pattern formed on the second surface are electrically connected to each other through a conductive via hole formed through the substrate. A resonance circuit is formed by the first inductive conduction pattern, the second inductive conduction pattern, inductance of the conductive via hole, the capacitor, and capacitance between the first inductive conduction pattern and the second inductive conduction pattern.

BRIEF DESCRIPTION OF THE DRAWINGS

The above and other objects, features, and other advantages of the present disclosure should be more clearly understood from the following detailed description taken in conjunction with the accompanying drawings, in which.

DETAILED DESCRIPTION OF THE DISCLOSED EMBODIMENTS

Hereinafter, various embodiments of a metamaterial electromagnetic absorber according to the present disclosure are described in detail with reference to the accompanying drawings.

Figure 1:
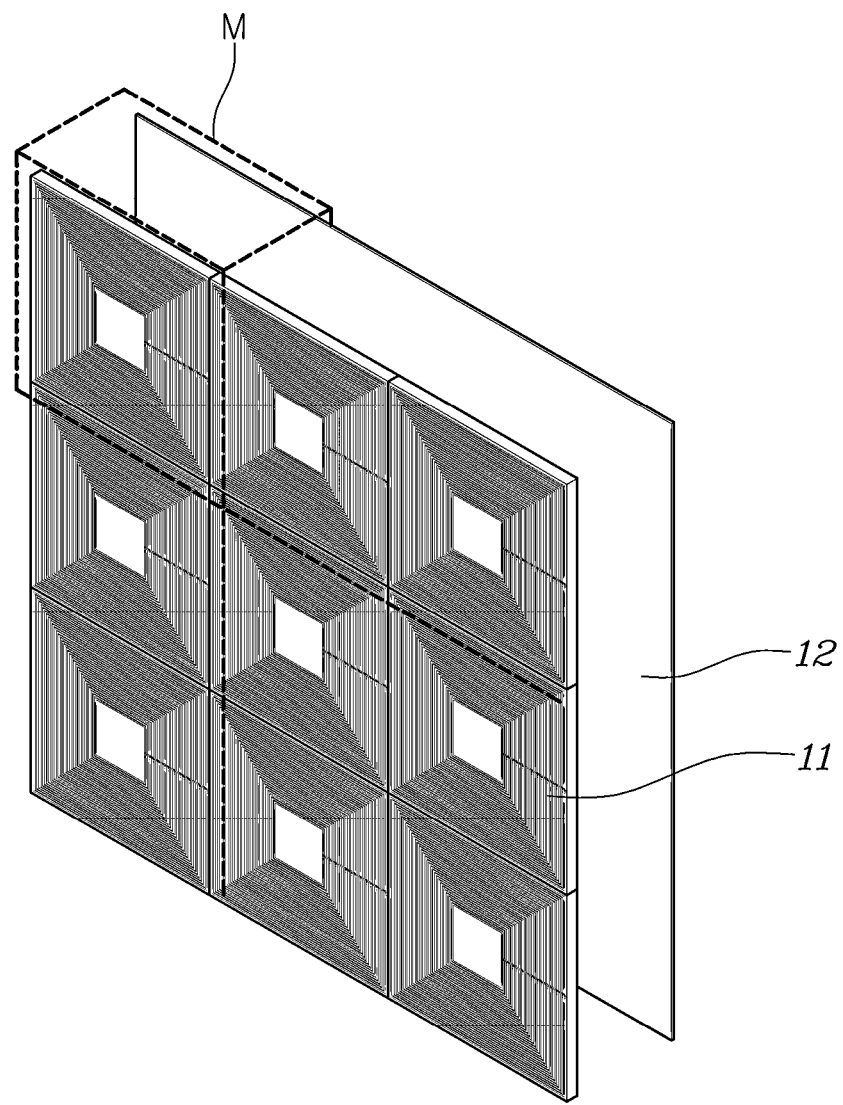
FIG. 1 is a perspective view showing a metamaterial electromagnetic absorber according to an embodiment of the present disclosure.
Figure 2:
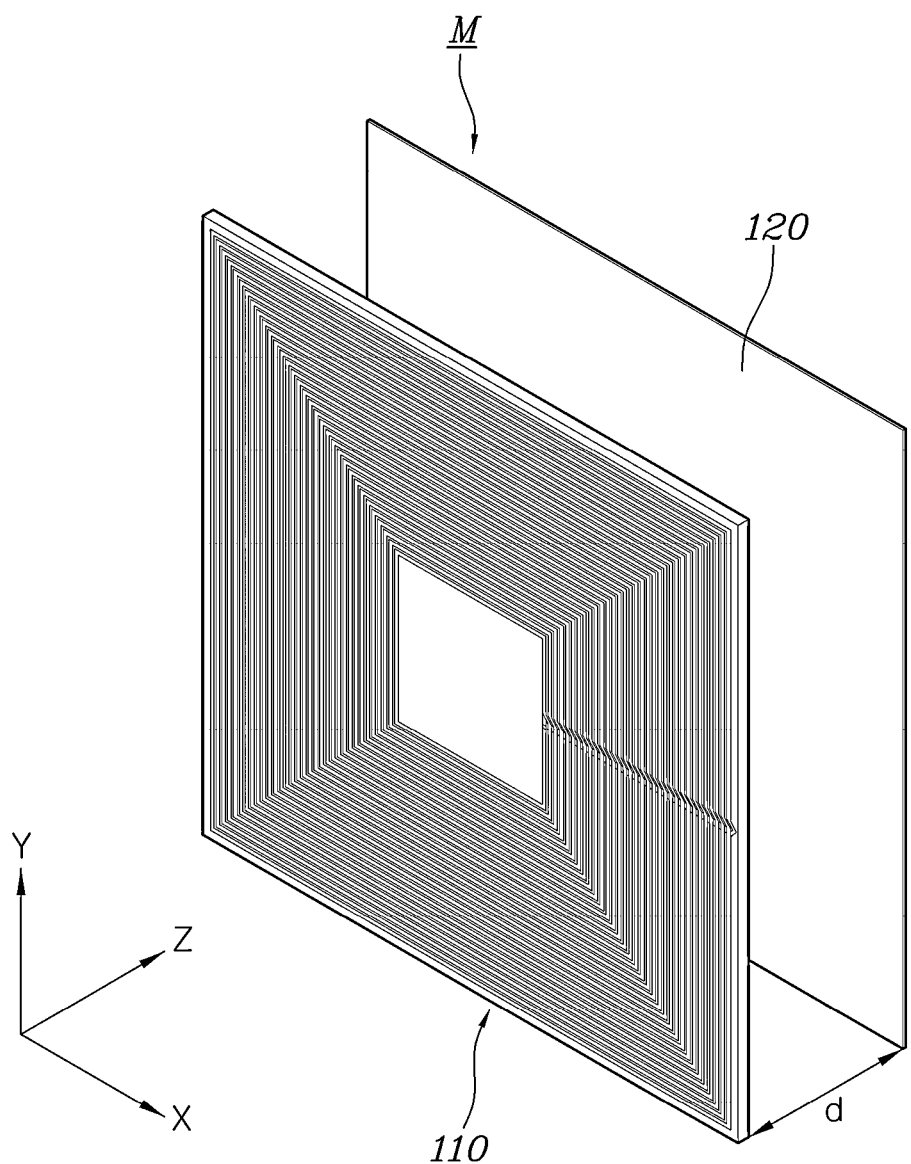
FIG. 2 is a perspective view showing a unit cell constituting the metamaterial electromagnetic absorber shown in FIG. 1.
Figure 3:
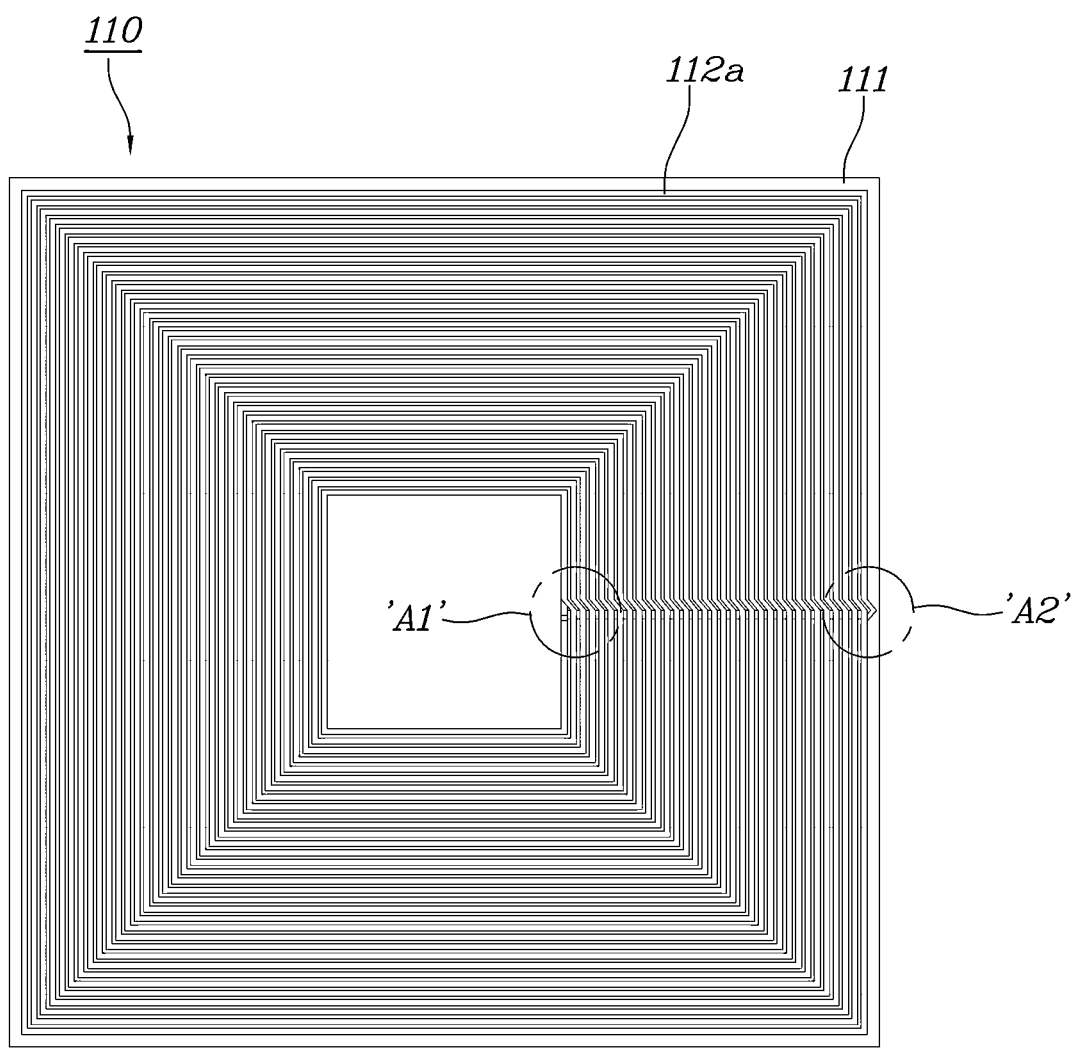
FIG. 3 is a plan view of the unit cell constituting the metamaterial electromagnetic absorber shown in FIG. 1.
Figure 4:
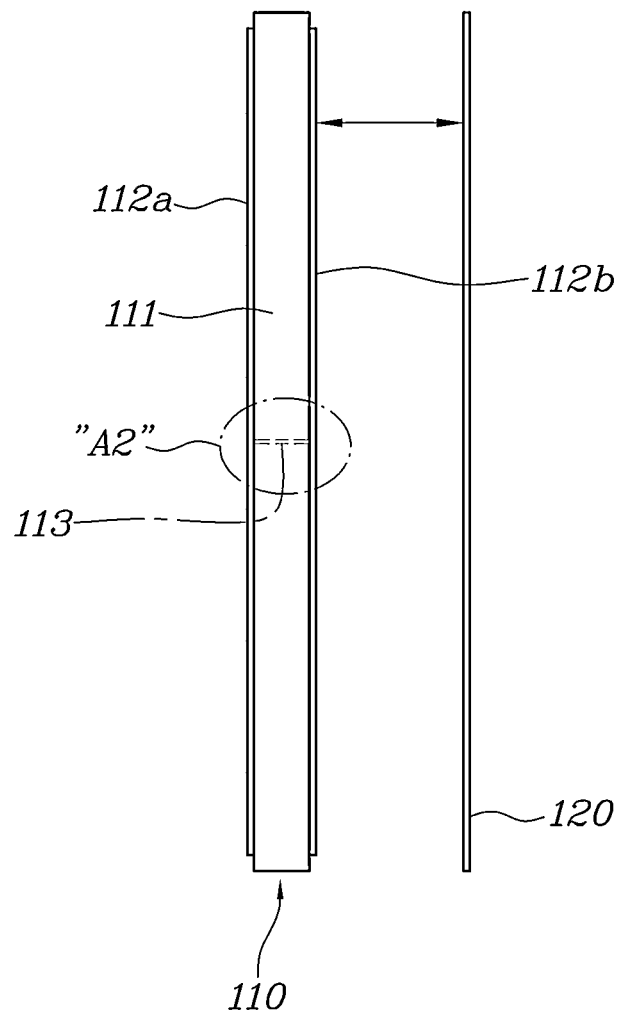
FIG. 4 is a side view of the unit cell constituting the metamaterial electromagnetic absorber shown in FIG. 1.
Figure 5:
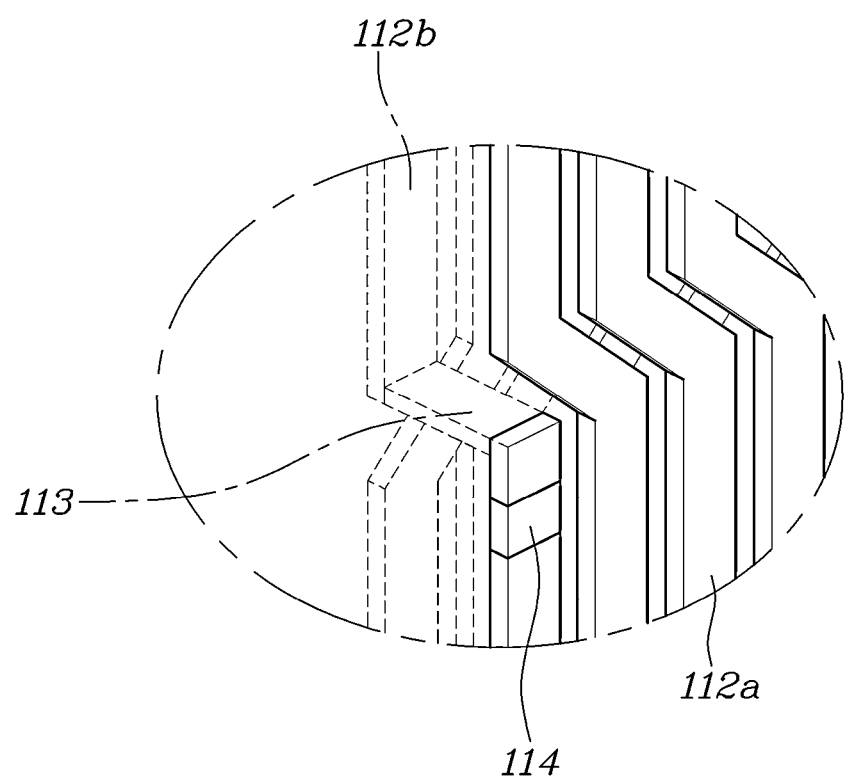
FIGS. 5 and 6 are enlarged perspective views showing a portion of the metamaterial electromagnetic absorber shown in FIGS. 3 and 4.
Figure 6:
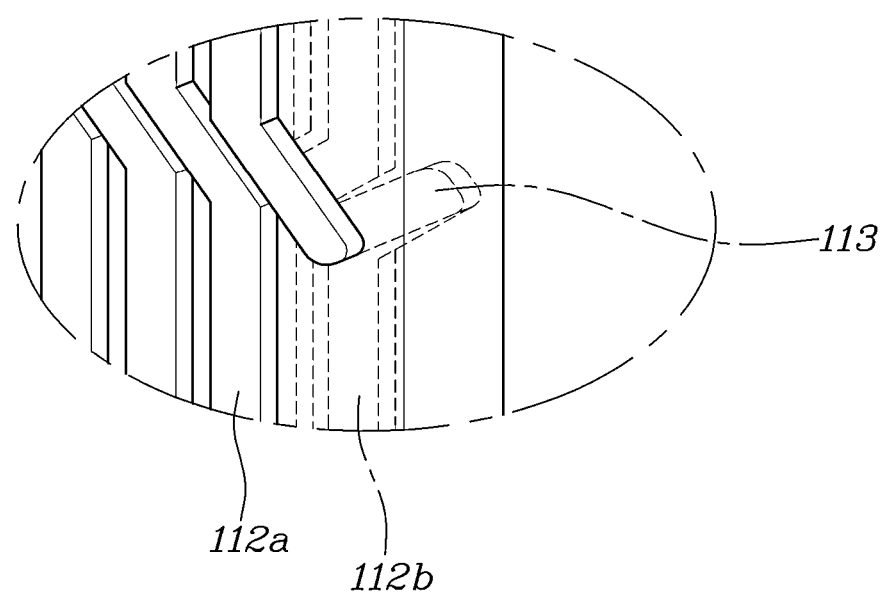
Figure 7:
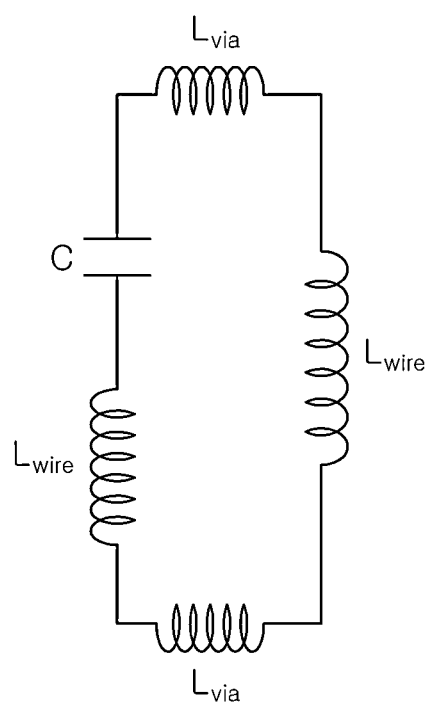
FIG. 7 is a circuit diagram of a resonance circuit formed by the metamaterial electromagnetic absorber according to the embodiment of the present disclosure.

FIG. 1 is a perspective view showing a metamaterial electromagnetic absorber according to an embodiment of the present disclosure. FIG. 2 is a perspective view showing a unit cell constituting the metamaterial electromagnetic absorber shown in FIG. 1. In addition, FIG. 3 is a plan view of the unit cell constituting the metamaterial electromagnetic absorber shown in FIG. 1. FIG. 4 is a side view of the unit cell constituting the metamaterial electromagnetic absorber shown in FIG. 1. In addition, FIGS. 5 and 6 are enlarged perspective views showing a portion of the metamaterial electromagnetic absorber shown in FIGS. 3 and 4. FIG. 7 is a circuit diagram of a resonance circuit formed by the metamaterial electromagnetic absorber according to the embodiment of the present disclosure.

Referring to FIGS. 1-7, the metamaterial electromagnetic absorber according to an embodiment of the present disclosure may be realized in the form of a structure 11 or 110 including a substrate 111 having a first surface on which electromagnetic waves are incident and a second surface opposite the first surface. The substrate may be made of a metamaterial. A first inductive conduction pattern 112a and a second inductive conduction pattern 112b may be formed on the first surface and the second surface, respectively.

In addition, the metamaterial electromagnetic absorber according to an embodiment of the present disclosure may include a conductive plate 12 or 120 disposed spaced apart from the substrate 111 by a predetermined distance in a direction away from the second surface of the structure 11 or 110. The conductive plate 12 or 120 may be made of a conductive material and the conductive plate 12 or 120 may be grounded. In one embodiment, the conductive plate 12 or 120 is made of a conductive material, such as copper, and is grounded. Consequently, it is possible to prevent electromagnetic waves, after passing through the structure 11 or 110 including the substrate 111 and the inductive conduction patterns 112a and 112b, from passing through the conductive plate 12 or 120.

FIG. 1 shows an electromagnetic absorber including a plurality of unit cells M. Each unit cell M itself may act as an electromagnetic absorber. FIG. 1 shows an electromagnetic absorber having a structure in which unit cells M are disposed in a 3×3 matrix by way of example. Depending on the size of a region requiring electromagnetic shielding, however, the electromagnetic absorber may be constituted by a single unit cell M, or two or more unit cells M may be coupled in a lateral direction.

The substrate 111 may be made of a metamaterial having permittivity.

The metamaterial means a material capable of artificially realizing electromagnetic properties that cannot naturally exist by periodically arranging a metal or a dielectric material. The electromagnetic properties of the metamaterial may be obtained from a structural factor, such as arrangement of a material, such as a metal or a dielectric material that is used, rather than the composition of the material. For example, a glass-reinforced epoxy laminate, generally known as FR4, used to manufacture a printed circuit board, etc. may be adopted as the metamaterial.

In addition, the substrate 111 may be realized by one of polyester, epoxy, silicone, Teflon, and the like, or a combination of two or more thereof.

In addition, the substrate 111 may have the form of a plate. The first conduction pattern 112a and the second conduction pattern 112b may be formed on one surface (first surface) and the other surface (second surface) of the plate, respectively.

Each of the first conduction pattern 112a and the second conduction pattern 112b may be made of a conductive metal, such as gold, silver, platinum, aluminum, or copper, and may be formed so as to have an inductive pattern in order to form inductance. For example, as shown in FIGS. 1-4, each of the first conduction pattern 112a and the second conduction pattern 112b may have a planer quadrangular coil pattern or may be realized by any of various other patterns capable of forming inductance.

The first conduction pattern 112a and the second conduction pattern 112b are opposite each other in the state in which the substrate 111, which is a dielectric material, is interposed therebetween. Consequently, capacitance may be formed between the two conduction patterns 112a and 112b. In one embodiment, the first conduction pattern 112a and the second conduction pattern 112b are opposite each other so as to have the maximum opposite areas in order to form capacitance having sufficient magnitude. Also, the first conduction pattern 112a and the second conduction pattern 112b are disposed in a symmetrical fashion in order to secure the maximum capacitance even when an error occurs in a manufacturing process thereof.

Furthermore, in order to secure larger, i.e., higher capacitance, an additional capacitor 114 may be installed at the first conduction pattern 112a or the second conduction pattern 112b so as to have a series connection structure. In one embodiment, the capacitor 114 is a chip capacitor that can be mounted on the substrate 111. The capacitor 114 may be installed at the conduction patterns 112a and 112b so as to be connected thereto in series.

In addition, opposite ends of the first conduction pattern 112a formed on the first surface and the second conduction pattern 112b formed on the second surface may be electrically connected to each other through a conductive via hole 113 formed through the metamaterial. The conductive via hole 113 may also form an inductance component.

A resonance circuit shown in FIG. 7 may be realized by the first conduction pattern 112a, the second conduction pattern 112b, the conductive via hole 113, the capacitance between the two conduction patterns 112a and 112b, and the additional capacitor 114. The resonance circuit formed by the metamaterial electromagnetic absorber according to the present disclosure may provide a resonance frequency based on inductance and capacitance in order to induce resonance of electromagnetic waves incident on the metamaterial electromagnetic absorber.

In brief, the structure of the electromagnetic absorber described above is capable of forming inductance through the lengths of the conduction patterns 112a and 112b disposed on the opposite surfaces of the substrate 111 made of the metamaterial and forming capacitance through the distance between the conduction patterns 112a and 112b.

Impedance of the electromagnetic absorber may be adjusted through the ratio between the inductance and the capacitance formed by the metamaterial substrate 111 and the conduction patterns 112a and 112b. The impedance of the electromagnetic absorber may be matched with impedance in a free space, whereby it is possible to minimize a reflected wave.

In addition, the conductive plate 12 or 120 may be disposed spaced apart from the structure constituted by the metamaterial substrate 111 and the conduction patterns 112a and 112b, whereby it is possible to remove a transmitted wave. Electromagnetic waves reflected by the conductive plate 12 or 120 may be extinguished due to inner loss of the metamaterial substrate 111.

As described above, the metamaterial electromagnetic absorber according to embodiments of the present disclosure is capable of minimizing a reflected wave and a transmitted wave, thereby achieving high electromagnetic absorptivity.

In order to secure capacitance having larger or higher magnitude in addition to capacitance obtained through the distance between the conduction patterns, desired impedance and resonance frequency may be achieved further using the chip capacitor.

Figure 8:
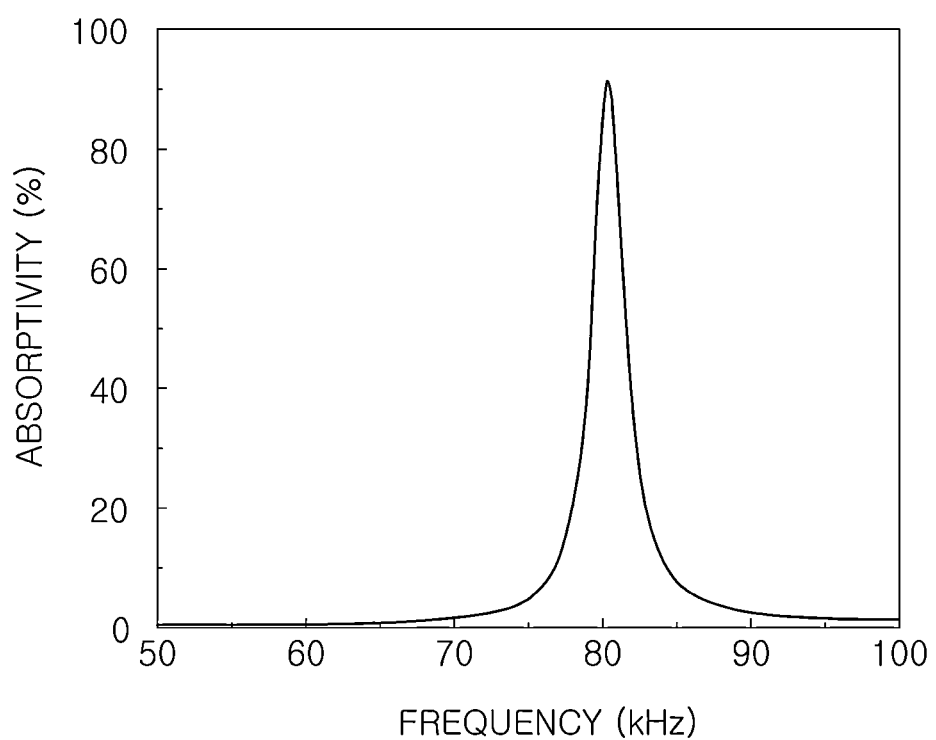
FIGS. 8 and 9 are graphs showing an electromagnetic shielding effect achieved by the metamaterial electromagnetic absorber according to the embodiment of the present disclosure.
Figure 9:
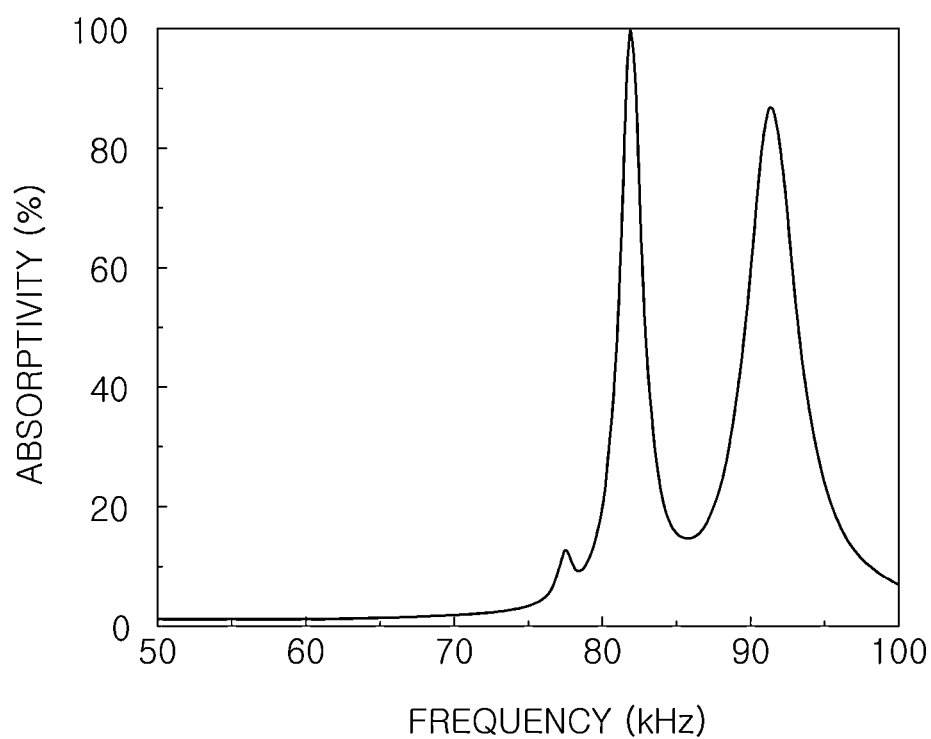

FIGS. 8 and 9 are graphs showing an electromagnetic shielding effect achieved by the metamaterial electromagnetic absorber according to an embodiment of the present disclosure.

In particular, FIG. 8 is a graph showing the results of simulation of absorptivity of a metamaterial electromagnetic absorber when assuming that unit cells M are periodically arranged to an unlimited extent. FIG. 9 is a graph showing the results of simulation of absorptivity of a metamaterial electromagnetic absorber having a structure in which unit cells M are disposed in a 3×3 matrix, as shown in FIG. 1.

In FIG. 8, which shows the results of a simulation performed under the assumption that the unit cells M of the metamaterial electromagnetic absorber are unlimitedly arranged, a high absorptivity of 90% or more can be maintained at 80 kHz, which is a target frequency.

In FIG. 9, which shows the results of a simulation of absorptivity of an electromagnetic absorber having a structure in which unit cells M are disposed in a 3×3 matrix, it can be seen that a very high absorptivity of 95% or more can be maintained at about 80 kHz when unit cells M disposed in a 3×3 matrix are provided.

The number of turns of each of the first conduction pattern 112a and the second conduction pattern 112b may be adjusted depending on the frequency of electromagnetic waves to be shielded. Capacitance of the additional capacitor 114 may also be adjusted.

As shown in FIGS. 8 and 9, the metamaterial electromagnetic absorber according to various embodiments of the present disclosure is realized using an inexpensive material, such as FR4, and copper while securing electromagnetic shielding performance having the same level as an electromagnetic shielding agent using ferrite and aluminum. The overall weight of the metamaterial electromagnetic absorber may thus be reduced, and the manufacturing cost of the metamaterial electromagnetic absorber may thus also be reduced.

As should be apparent from the above description, the metamaterial electromagnetic absorber uses an inexpensive material, such as FR4, and copper, unlike a conventional electromagnetic shielding agent using ferrite and aluminum. Consequently, the overall weight and the manufacturing cost of the metamaterial electromagnetic absorber are reduced.

The effects of the present disclosure are not limited to those mentioned above. Other unmentioned effects should be clearly understood by a person of ordinary skill in the art from the above description.

Although the various embodiments of the present disclosure have been described above with reference to the accompanying drawings, those having ordinary skill in the art should appreciate that the present disclosure can be implemented in various other embodiments without changing the technical ideas or features thereof.

What is claimed is:

1. A metamaterial electromagnetic absorber comprising:
a substrate having a first surface on which electromagnetic waves are incident and a second surface opposite the first surface, the substrate being made of a metamaterial; and
a first inductive conduction pattern and a second inductive conduction pattern formed on the first surface and the second surface, respectively,
wherein the first inductive conduction pattern and the second inductive conduction pattern are formed in a symmetrical fashion,
wherein opposite ends of the first inductive conduction pattern and the second inductive conduction pattern are electrically connected to each other through a conductive via hole formed through the substrate, and
wherein the via hole directly connects the first inductive conduction pattern and the second inductive conduction pattern.

2. The metamaterial electromagnetic absorber according to claim 1, further comprising a conductive plate disposed spaced apart from the substrate in a direction away from the second surface, the conductive plate being grounded.

3. The metamaterial electromagnetic absorber according to claim 1, wherein the metamaterial is one of glass-reinforced epoxy laminate (FR4), polyester, epoxy, silicone, Teflon, or a combination of two or more thereof.

4. The metamaterial electromagnetic absorber according to claim 1, wherein the first inductive conduction pattern and the second inductive conduction pattern are electrically connected to each other to form a resonance circuit.

5. The metamaterial electromagnetic absorber according to claim 1, further comprising a capacitor connected to the inductive conduction pattern in series.

6. The metamaterial electromagnetic absorber according to claim 4, further comprising a capacitor connected to the inductive conduction pattern in series.

7. A metamaterial electromagnetic absorber comprising:
a substrate having a first surface on which electromagnetic waves are incident and a second surface opposite the first surface, the substrate being made of a metamaterial;
a first inductive conduction pattern and a second inductive conduction pattern formed on the first surface and the second surface, respectively, the first inductive conduction pattern and the second inductive conduction pattern being formed in a symmetrical fashion;

a capacitor connected to the inductive conduction pattern in series; and a conductive plate disposed spaced apart from the substrate in a direction away from the second surface, the conductive plate being grounded, wherein opposite ends of the first inductive conduction pattern and the second inductive conduction pattern are electrically connected to each other through a conductive via hole formed through the substrate, wherein a resonance circuit is formed by the first inductive conduction pattern, the second inductive conduction pattern, inductance of the conductive via hole, the capacitor, and capacitance between the first inductive conduction pattern and the second inductive conduction pattern, and wherein the via hole directly connects the first inductive conduction pattern and the second inductive conduction pattern.

* * * * *